(12) United States Patent
Murata et al.

(10) Patent No.: US 6,492,885 B1
(45) Date of Patent: Dec. 10, 2002

(54) LC COMPONENT WITH GROOVES CUT IN THE CAPACITOR ELECTRODE

(75) Inventors: Satoshi Murata, Yokaichi; Hideyuki Mihara, Gamo; Etsuji Yamamoto; Minoru Tamada, both of Yokaichi, all of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 5 days.

(21) Appl. No.: 09/610,089

(22) Filed: Jul. 1, 2000

(30) Foreign Application Priority Data

Jun. 30, 1999 (JP) .......................... 11-185107
Jul. 9, 1999 (JP) .......................... 11-196338

(51) Int. Cl.⁷ ................................ H03H 7/01
(52) U.S. Cl. ................... 333/185; 333/175; 361/270
(58) Field of Search ................... 333/175, 184, 333/185; 361/270

(56) References Cited

U.S. PATENT DOCUMENTS

| | | | | |
|---|---|---|---|---|
| 2,416,683 A | * | 3/1947 | Finch et al. ............ | 361/270 X |
| 5,450,278 A | * | 9/1995 | Lee et al. ............... | 333/185 X |
| 5,764,126 A | * | 6/1998 | Kanetaka et al. ....... | 333/185 X |
| 6,133,809 A | * | 10/2000 | Tomohiro et al. .......... | 333/185 |

\* cited by examiner

*Primary Examiner*—Justin P. Bettendorf
(74) *Attorney, Agent, or Firm*—Keating & Bennett, LLP

(57) ABSTRACT

An LC component includes a coil conductor spirally wound around the outer peripheral surface of a wound core member having a substantially rectangular cross-section. A dielectric layer is arranged so as to cover the coil conductor. A capacitor electrode is provided on the dielectric layer so as to wind approximately once around the wound core member in the peripheral direction of the wound core member. The capacitor electrode includes first, second, third, and fourth surfaces. The capacitor electrode is divided by two cut grooves. One cut groove crosses the capacitor electrode obliquely from one side of the first surface of the capacitor electrode to the other side of the second surface adjacent to the first surface. Similarly, the other cut groove crosses the capacitor electrode obliquely from one side of the third surface of the capacitor electrode to the other side of the fourth surface adjacent to the third surface.

20 Claims, 7 Drawing Sheets

LC COMPONENT WITH GROOVES CUT IN THE CAPACITOR ELECTRODE

BACKGROUND OF THE INVENTION

1. Field of the Invention

The present invention relates to an LC component, and more particularly, to a surface mount type LC component for use as a noise filter.

2. Description of the Related Art

An example of a conventional LC component is shown in FIG. 14. In an LC component 1, terminal electrodes 2 and 3 are provided on both ends of a columnar wound core member having a spiral coil provided around the peripheral surface thereof. A dielectric layer 7 is provided on the central surface of the wound core member so as to cover the spiral coil. Further, on the dielectric layer 7, a ring capacitor electrode 8 is provided and wound once around the wound core member in the outer peripheral direction. FIG. 15 is an equivalent electric circuit diagram of the LC component 1.

The ring capacitor electrode 8 functions as a one turn coil, a so-called short ring, because it is wound once around the peripheral surface of the wound core member. For this reason, a magnetic flux caused by an electric current flowing through the spiral coil is interlinked with the ring capacitor electrode 8 so that an induced current flows in the ring capacitor electrode 8. The induced current circulates in the capacitor electrode 8 consuming energy. Therefore, the conventional LC component 1 has the problem that the Q value and the inductance of the spiral coil are low.

SUMMARY OF THE INVENTION

To overcome the problems described above, preferred embodiments of the present invention provide an LC component in which a capacitor electrode does not function as a short ring, and the Q value and the inductance of a coil are high.

According to a first preferred embodiment of the present invention, an LC component includes a wound core member, a coil conductor spirally wound around the outer peripheral surface of the wound core member, a dielectric layer arranged to cover the coil conductor, a capacitor electrode provided on the dielectric layer, and a cut groove arranged to divide the capacitor electrode.

According to a second preferred embodiment of the present invention, an LC component includes a wound core member having a substantially rectangular cross-section, a coil conductor spirally wound around the outer peripheral surface of the wound core member, a dielectric layer arranged to cover the coil conductor, a capacitor electrode provided on the dielectric layer so as to wind approximately once around the wound core member in the outer peripheral direction of the wound core member, a first cut groove crossing the capacitor electrode from one side of a first surface of the capacitor electrode to the other side of a second surface adjacent to the first surface, and a second cut groove crossing the capacitor electrode from one side of a third surface of the capacitor electrode to the other side of a fourth surface adjacent to the third surface.

According to a third preferred embodiment of the present invention, an LC component includes a wound core member having a substantially circular cross-section, a coil conductor spirally wound around the outer peripheral surface of the wound core member, a dielectric layer arranged to cover the coil conductor, a capacitor electrode provided on the dielectric layer so as to wind approximately once around the wound core member in the outer peripheral direction of the wound core member, and having four areas in the outer peripheral direction of the wound core member, a first cut groove crossing the capacitor electrode from one side of the first area of the capacitor electrode to the other side of the second area adjacent to the first area, and a second cut groove crossing the capacitor electrode from one side of the third area of the capacitor electrode to the other side of the fourth area adjacent to the third area.

The coil conductor is preferably a spiral coil formed by laser working, or other suitable methods.

The capacitor electrode preferably has a band shape but may have other suitable shapes.

The coil conductor covered with the dielectric layer is protected by the dielectric layer. The dielectric layer constituting the capacitor also functions as a protection layer for the coil conductor.

The capacitor electrode does not function as a short ring because it is divided by the cut groove. That is, when a magnetic flux caused by a current flowing through the coil conductor is interlinked with the capacitor electrode, no circulating current flows in the capacitor electrode. As a result of this unique arrangement, the Q value and the inductance of a coil are high.

Other features, characteristics, elements and advantages of the present invention will become apparent from the following description of preferred embodiments thereof with reference to the attached drawings.

DETAILED DESCRIPTION OF PREFERRED EMBODIMENTS

Hereinafter, preferred embodiments of the LC component of the present invention will be described with reference to the accompanying drawings.

Figure 1:
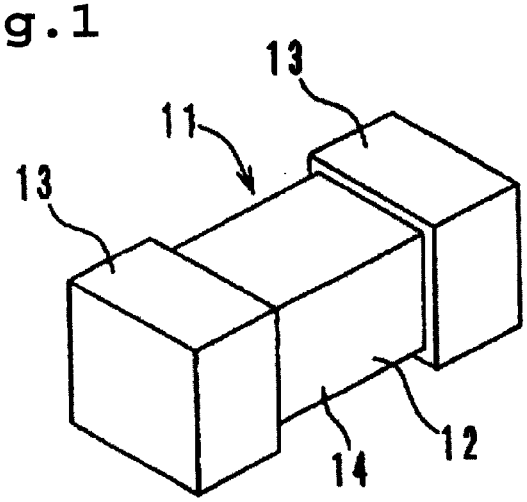
FIG. 1 is a perspective view showing manufacturing procedures for an LC component according to a preferred embodiment of the present invention.

A preferred embodiment of the LC component of the present invention, together with a method of producing the same, will be described. As shown in FIG. 1, a preferred embodiment of the LC component preferably includes a wound core member 11 having a columnar body portion 12 having a substantially rectangular cross-section, and terminal portions 13 provided at both ends of the body portion 12. As materials for the wound core member 11, magnetic materials such as ferrite or other suitable magnetic materials, ceramic materials such as non-magnetic alumina or other suitable ceramic materials, resin materials, and so forth may be used. A thin film conductor 14 is provided on the whole surface of the wound core member 11 by a technique such as plating, sputtering, or other suitable technique. The thin film conductor 14 is preferably made of C, Ag, Ag—Pd, or other suitable material.

Figure 2:
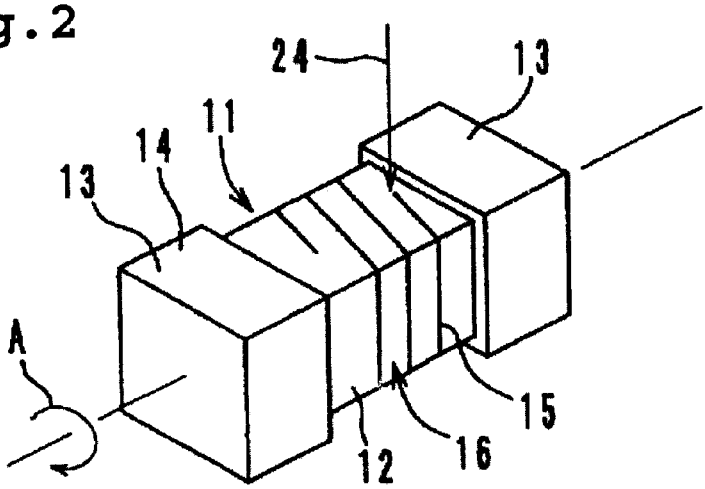
FIG. 2 is a perspective view showing manufacturing procedures for the LC component following those of FIG. 1.

The terminal portion 13 of the wound core member 11 is fixed in a chuck to the spindle of a laser working machine (not shown). By driving the spindle, the wound core member 11 is rotated in the direction indicated by the arrow A, as shown in FIG. 2. Simultaneously, the body portion 12 of the wound core member 11 is irradiated with a laser beam, and scanned in the longitudinal direction of the wound core member 11. Thereby, the portion of the thin film conductor 14 irradiated with the laser beam is removed, so that a spiral groove 15 is produced. Thus, a coil conductor 16 spirally winding around the peripheral surface of the body portion 12 of the wound core member 11 is produced.

Figure 3:
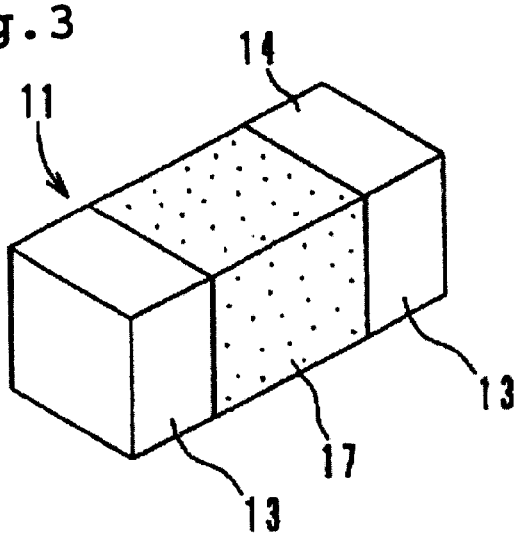
FIG. 3 is a perspective view showing manufacturing procedures for the LC component following those of FIG. 2.

Next, a dielectric layer 17 is provided on the surface of the body portion 12 of the wound core member 11 so as to cover the coil conductor 16, as shown in FIG. 3. The dielectric layer 17, when it is made of a ceramic material, is formed by sputtering or other suitable technique. When it is made of a resin material, the dielectric layer is preferably formed by coating and drying or other suitable technique. Thereafter, a conductor film is provided on the whole surface of the wound core member 11 by a technique such as electroless plating, vacuum vapor deposition, sputtering, or other suitable technique. Then, the unnecessary portion of the conductor film is removed by a technique such as laser beam irradiation, etching or other suitable technique with only the necessary portion thereof being left.

Figure 4:
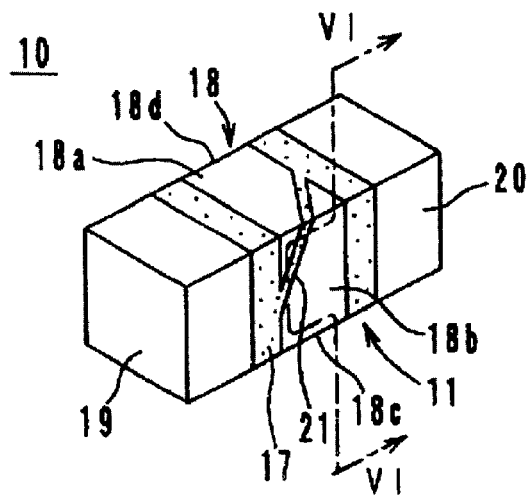
FIG. 4 is a perspective view showing an LC component 10 of a preferred embodiment of the present invention.

Thus, an LC component 10 as shown in FIG. 4 is produced. On the terminal electrodes 13 of the wound core member 11, namely, on both end portions of the LC component 10, input-output terminal electrodes 19 and 20 are provided. The end portions of the coil conductor 16 (see FIG. 2) provided on the surface of the body portion 12 are connected to the input-output terminal electrodes 19 and 20, respectively. A capacitor electrode 18 is provided on the surface of the dielectric layer 17 on the approximate central surface of the LC component 10 so as to wind approximately once around the LC component 10 in the outer peripheral direction thereof.

In FIG. 4, the capacitor electrode 18 includes the upper side (first surface) 18a, the front side (second surface) 18b, the bottom (third surface) 18c, and the back side (fourth surface) 18d.

Figure 5:
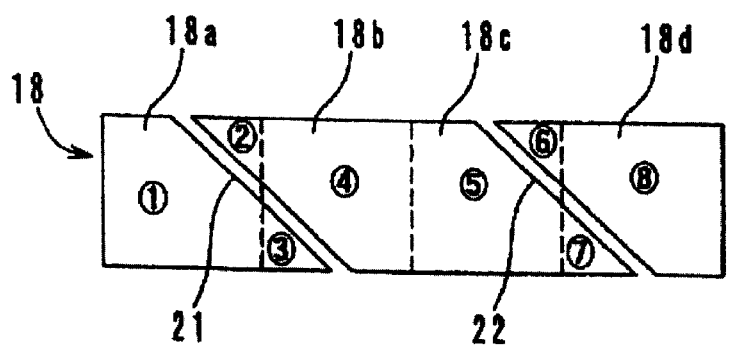
FIG. 5 is an example of the capacitor electrode 18 shown in FIG. 4.

FIG. 5 shows an example of the capacitor electrode 18. The capacitor electrode 18 is divided by two cut grooves 21 and 22. The cut groove 21 is arranged so as to cross the capacitor electrode 18 obliquely from one side of the first surface 18a to the other side of the second surface 18b. Similarly, the cut groove 22 is arranged so as to cross obliquely the capacitor electrode 18 from one side of the third surface 18c to the other side of the fourth surface 18d. By providing the cut grooves 21 and 22 on the four surfaces 18a to 18d as described above, the directivity of the LC component 10, presented when the LC component 10 is, mounted, can be removed. The capacitor electrode 18 also functions as a ground terminal electrode. In FIG. 5, the. reference numerals (1) to (8) represent the electrode pieces on the respective surfaces 18a to 18d which are divided by the cut grooves 21 and 22, respectively.

Further, an insulation armor resin is coated and baked with the input-output terminal electrodes 19 and 20 and the capacitor electrode 18 remaining uncoated. After this, the area exposed from the armor resin is plated with nickel, tin, or other suitable material, so that the soldering properties of the electrodes 18, 19, and 20 are greatly improved.

Figure 15:
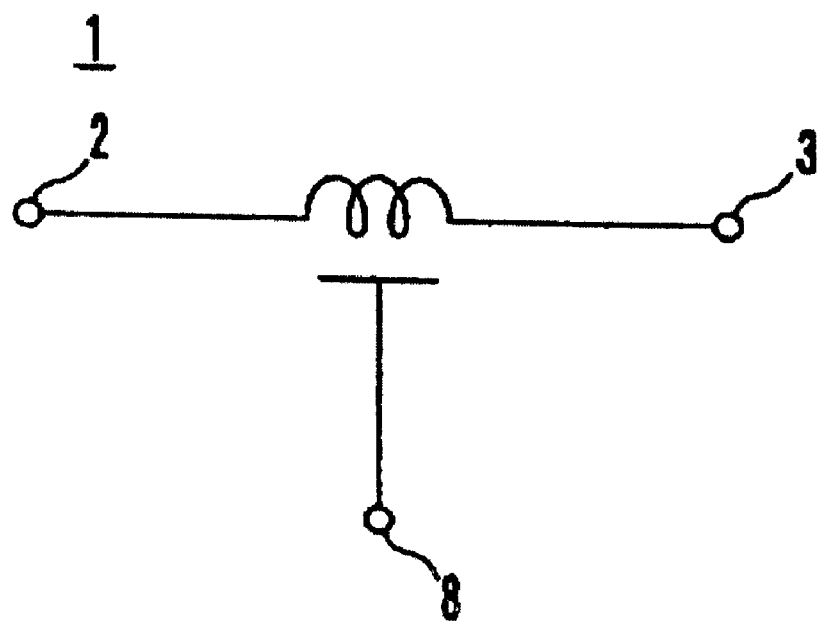
FIG. 15 is an equivalent electric circuit diagram of the LC component.

The LC component 10 configured as described above has an equivalent circuit shown in FIG. 15. The coil conductor 16 is connected between the input-output terminal electrodes 19 and 20. The capacitor electrode 18 is arranged opposite to the coil conductor 16. An electrostatic capacity is produced between the capacitor electrode 18 and the coil conductor 16 to define a capacitor C.

With the above-described novel configuration, the capacitor electrode 18 does not function as a short ring because it is divided by the cut grooves 21 and 22. That is, when a magnetic flux caused by a current flowing through the coil conductor 16 (see FIG. 2) is interlinked with the capacitor electrode 18, no circulating current flows in the capacitor electrode 18. Thus, the energy loss is suppressed, and reduction of the Q value of the coil conductor 16 is prevented.

Figure 6:
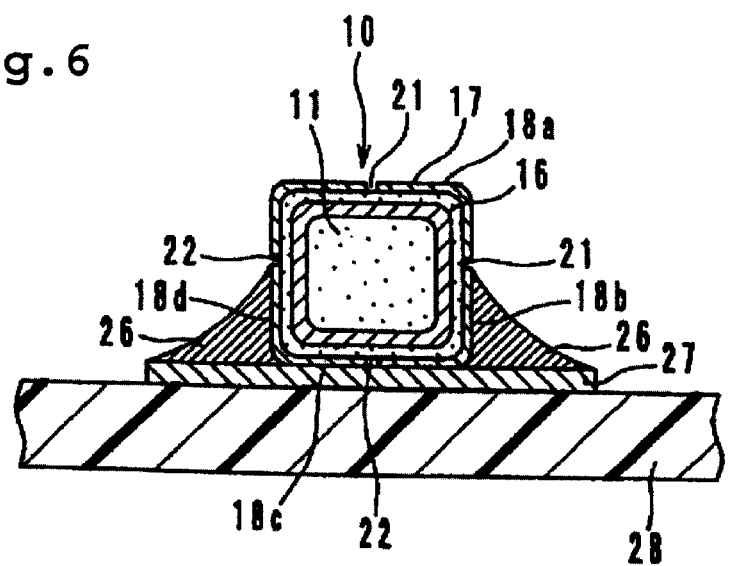
FIG. 6 is a cross-sectional view taken along line VI—VI, showing the state in which the LC component of FIG. 4 is mounted onto a printed substrate.

FIG. 6 illustrates an example of the state in which the LC component 10 is surface mounted onto a pattern 27 of a printed wiring board 28 by solder 26. The cross-section of FIG. 6 is that of the LC component 10 taken along the cross-sectioning line VI—VI of FIG. 4. The capacitor electrode 18 is electrically connected to the pattern 27 by the solder 26 while the third surface 18c is in contact with the pattern 27. The electrode pieces (5) and (6) (see FIG. 5) are electrically connected to the pattern 27. The electrode piece (5) is electrically connected to the electrode pieces (7), (4), and (2). The electrode piece (6) is electrically connected to the electrode pieces (8), (1), and (3). Accordingly, in this case, all the electrode pieces (1) to (8), in other words, the whole of the capacitor electrode 18 functions as a capacitor electrode.

Further, the solder 26 is blocked by the cut groove 21 provided on the first surface 18a and the second surface 18b. The electrode pieces (1) and (3) and the electrode pieces (2)

and (4) (see FIG. 5) are electrically divided by the cut groove 21. Accordingly, the short ring caused by the capacitor electrode 18 is prevented due to the cut groove 21. The following TABLE 1 shows the results obtained when the LC component 10 is soldered with the respective surfaces 18a to 18d of the capacitor electrode 18 being in contact with the pattern 27.

TABLE 1

| SOLDERING SURFACE | FIRST 18a | SECOND 18b | THIRD 18c | FOURTH 18d |
|---|---|---|---|---|
| electrode piece in contact with pattern 27 | 1, 2 | 3, 4 | 5, 6 | 7, 8 |
| one electrode piece in contact | 3, 8, 6 | 1, 8, 6 | 7, 4, 2 | 5, 4, 2 |
| the other electrode piece in contact | 4, 5, 7 | 2, 5, 7 | 8, 1, 3 | 6, 1, 3 |
| cut groove under working | 20 | 20 | 21 | 21 |

The present invention is not limited to the above-described preferred embodiments. Various changes and modifications may be made to the invention without departing from the sprit and scope thereof. For example, the coil conductor may be a conductive wire wound around the peripheral surface of a wound core member.

Figure 7:
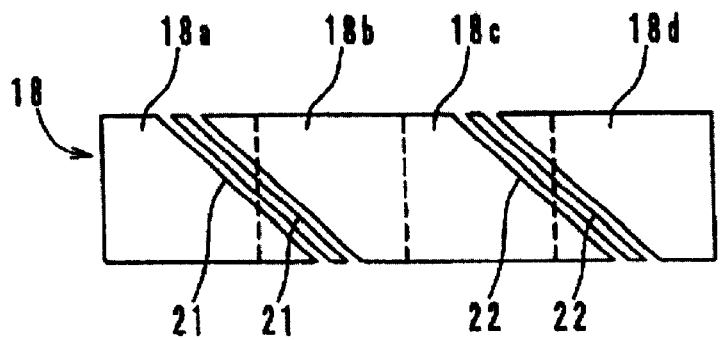
FIG. 7 is an example of a modification of the cut grooves.
Figure 8:
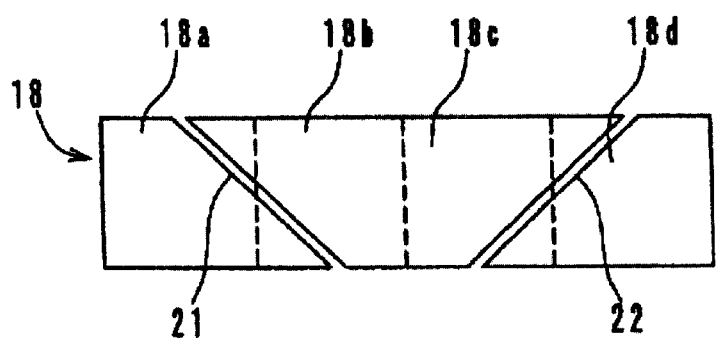
FIG. 8 is an example of a further modification of the cut grooves.
Figure 9:
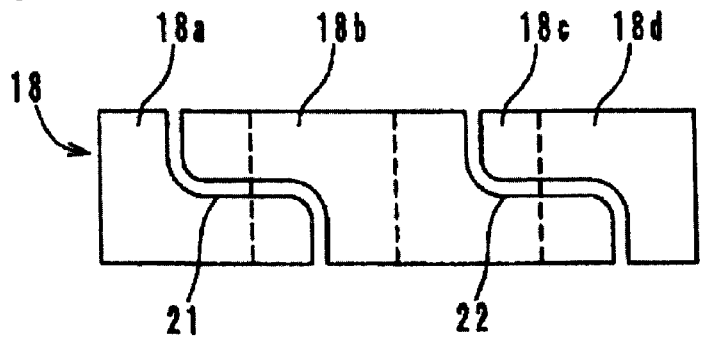
FIG. 9 is an example of still a further modification of the cut grooves.
Figure 10:
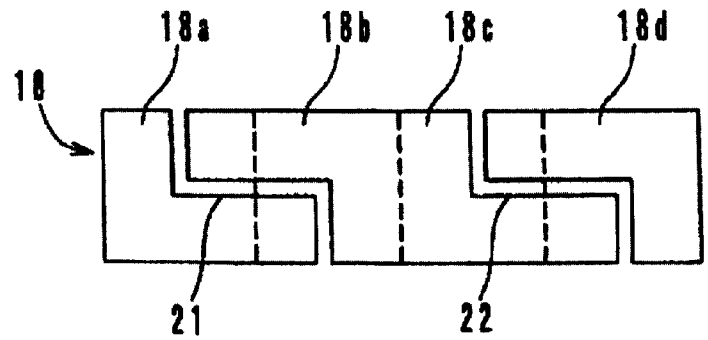
FIG. 10 is an example of an even further modification of the cut grooves.
Figure 11:
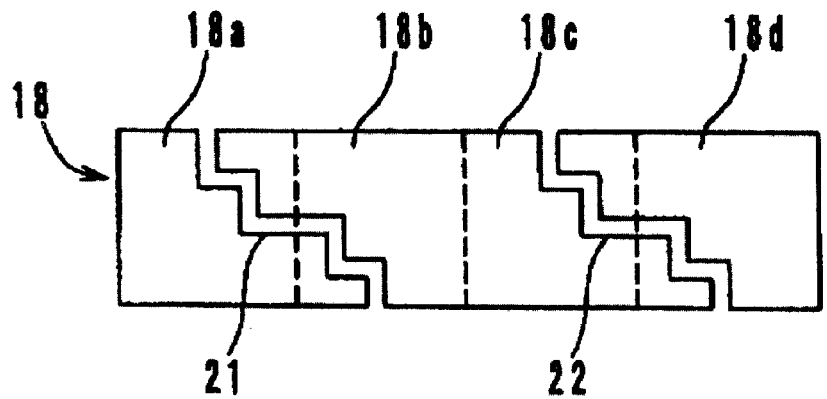
FIG. 11 is an example of another modification of the cut grooves.

Further, as shown in FIG. 7, a plurality of cut grooves 21 and 22 may be provided, so that the cut effect is ensured. Moreover, as seen in FIG. 8, it is not necessary for the cut grooves 21 and 22 to be arranged parallel to each other. The cut grooves 21 and 22 may be curved as shown in FIG. 9, may be bent as shown in FIG. 10, or may have a ladder-like shape as shown in FIG. 11.

Figure 12:
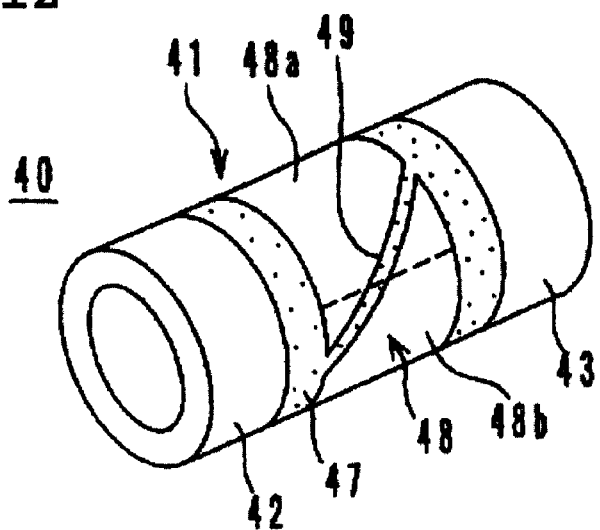
FIG. 12 is a perspective view of an LC component 10 according to another preferred embodiment of the present invention.

Moreover, the LC component of the present invention may be an LC component 40 shown in FIG. 12. In the LC component 40, input-output terminal electrodes 42 and 43 are provided on both end portions of a substantially cylindrical wound core member 41 having a spiral coil conductor provided on the peripheral surface thereof. A dielectric layer 47 is preferably provided on the approximate central surface of the wound core member 41 to cover the spiral coil conductor. Further, a capacitor electrode 48 is provided on the dielectric layer 47 to wind approximately once around the LC component 40 in the outer peripheral direction thereof.

Figure 13:
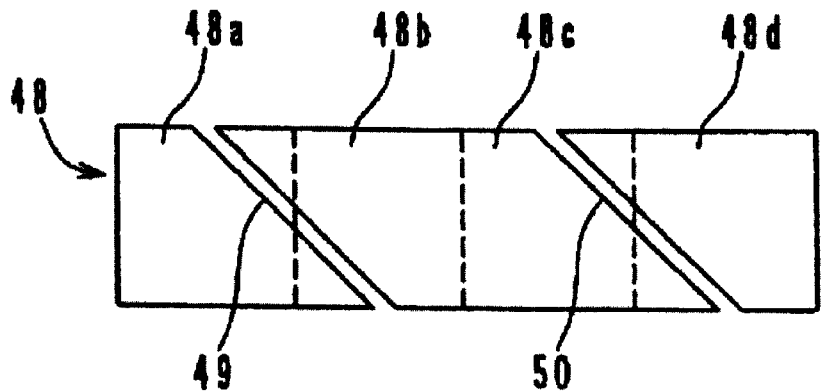
FIG. 13 is an example of the capacitor electrode shown in FIG. 12.
Figure 14:
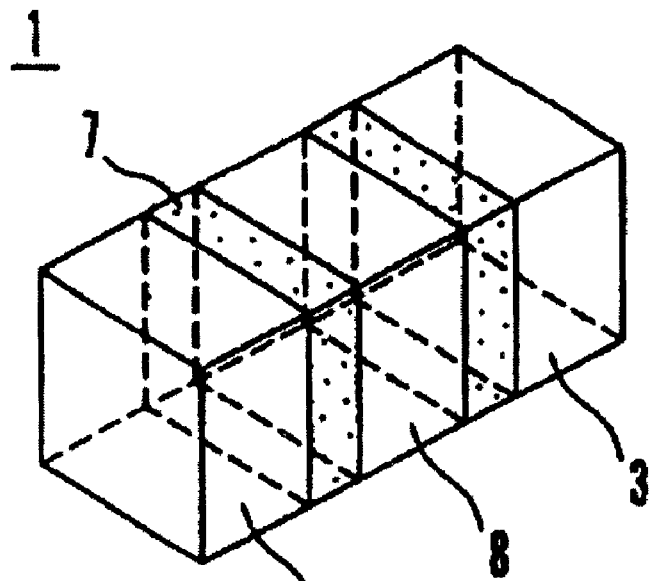
FIG. 14 is a perspective view of a conventional LC component.

The capacitor electrode 48 are equally divided into four areas, that is, first to fourth areas 48a, 48b, 48c, and 48d in the outer peripheral direction of the wound core member 41. FIG. 13 is a development of the capacitor electrode 48. The capacitor electrode 48 is divided by two cut grooves 49 and 50. The cut groove 49 is arranged so as to cross the capacitor electrode 48 obliquely from one side of the first area 48a to the other side of the second area 48b. Similarly, the cut groove 50 is provided so as to cross the capacitor electrode 48 obliquely from one side of the third area 48c to the other side of the fourth area 48d. With the above-described configuration, the LC component 40 has the same operation/working effect as the LC component 10 of the above-described preferred embodiment.

Figure 16:
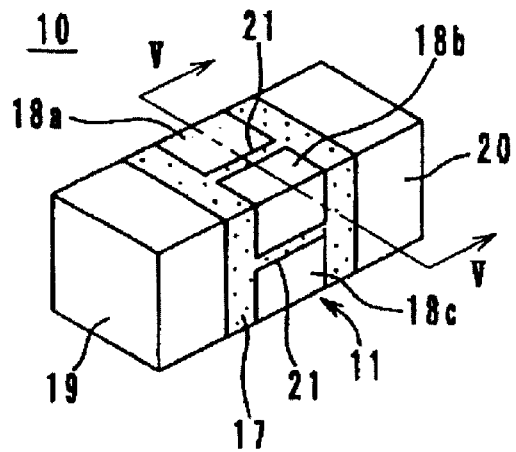
FIG. 16 is a perspective view showing an LC component according to a preferred embodiment of the present invention.

Referring to FIG. 16, the capacitor electrode includes capacitor electrodes 18a, 18b, 18c, and 18d. The capacitor electrodes 18a to 18d are divided by cut grooves 21. The cut grooves 21 are provided on the respective four outer peripheral surfaces of an LC component 10. By providing the cut grooves 21 on the four outer peripheral surfaces, respectively, the directivity of the LC component 10, presented when it is mounted, can be removed. The respective cut grooves 21 are elongated in the width direction (substantially perpendicular to the peripheral direction of the LC component 10 of the capacitor electrodes 18a to 18d). The capacitor electrodes 18a to 18d function as a ground terminal electrode.

Further, an insulation armor resin is coated and baked without the input-output terminal electrodes 19 and 20 and the capacitor electrodes 18a to 18d being coated. After this, the area exposed from the armor resin is plated with nickel, tin, or other suitable material, so that the soldering properties of the electrodes 18a to 18d, 19, and 20 are greatly improved.

The LC component 10 configured as described above has an equivalent circuit shown in FIG. 15. A coil conductor 16 is connected between the input-output terminal electrodes 19 and 20. The capacitor electrodes 18a to 18d are opposed to the coil conductor 16. An electrostatic capacity is produced between the capacitor electrodes 18a to 18d and the coil conductor 16 to produce a capacitor C.

With the above-described configuration, the capacitor electrodes 18a to 18d do not function as a short ring because they are divided by the cut grooves 21. That is, when a magnetic flux caused by a current flowing through the coil conductor 16 (see FIG. 2) is interlinked with the capacitor electrodes 18a to 18d, no circulating current flows in the capacitor electrodes 18a to 18d. By this, the energy loss is suppressed, that is, reduction of the Q value and inductance of the coil conductor 16 is prevented.

Figure 17:
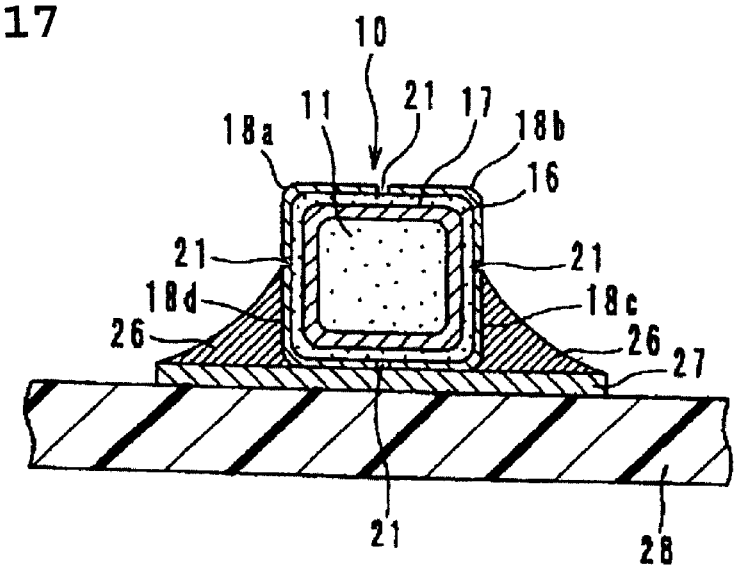
FIG. 17 is a cross-sectional view taken along the line V—V of FIG. 16.

FIG. 17 illustrates an example of the state in which the LC component 10 is surface mounted onto a pattern 27 of a printed wiring board 28 by a solder 26. The capacitor electrodes 18d and 18c are electrically connected to the pattern 27 by the solder 26. Accordingly, in this case, the capacitor electrodes 18d and 18c, and the coil conductor 16 define a capacitor C. The solder 26 is substantially blocked by the cut groove 21, so that the electrical connection between the capacitor electrodes 18a and 18d and also, and so that between the capacitor electrodes 18b and 18c do not occur. Even if the capacitor electrodes 18a and 18d, and the capacitor electrodes 18b and 18c are electrically connected, respectively, short-ring of the capacitor electrodes 18a to 18d are prevented by the cut groove 21 provided on the upper surface.

Figure 18:
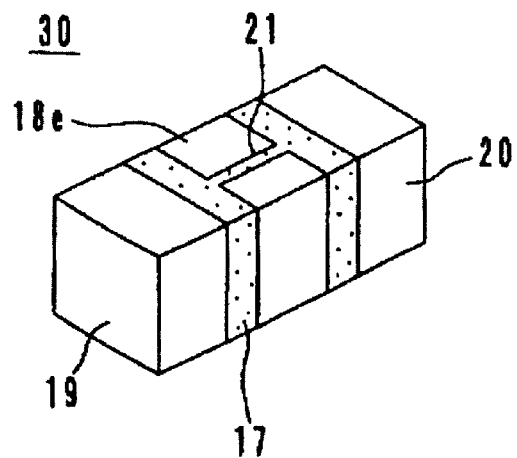
FIG. 18 is a perspective view showing a further preferred embodiment of the present invention.
Figure 19:
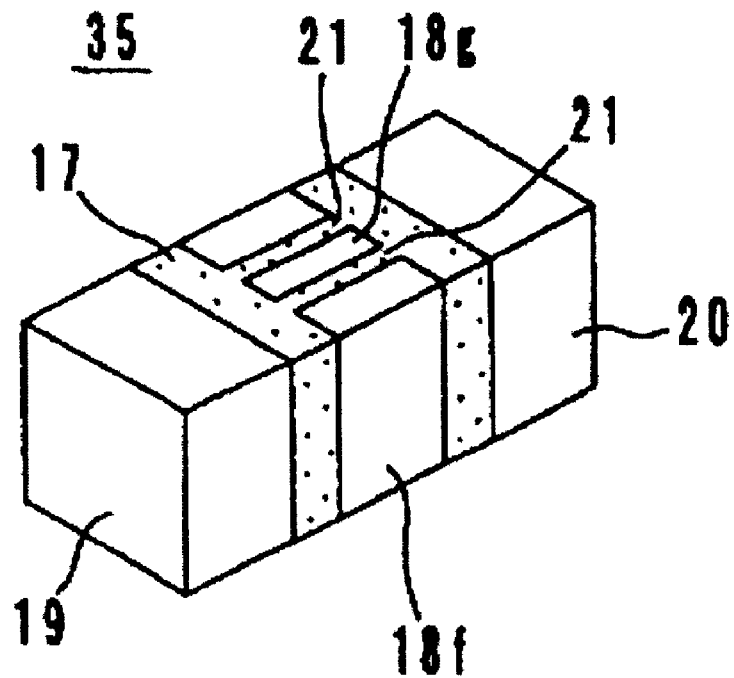
FIG. 19 is a perspective view showing still a further preferred embodiment of the present invention.

Moreover, the LC component of the present invention may be an LC component 30 having a cut groove 21 provided only on the upper surface thereof as shown in FIG. 18. In the LC component 30, the electrostatic capacity of a capacitor C is greatly increased because all of the capacitor electrode 18e is opposed to a coil conductor 16, in addition to the same advantages as the LC component 10 of the above-described preferred embodiments. Further, as shown in FIG. 19, the LC component of the present invention may be an LC component 35 having a plurality cut grooves 21 provided on the upper side thereof. Thus, a capacitor electrode 18f, sandwiching an intermediate electrode 18g, is effectively divided.

Figure 20:
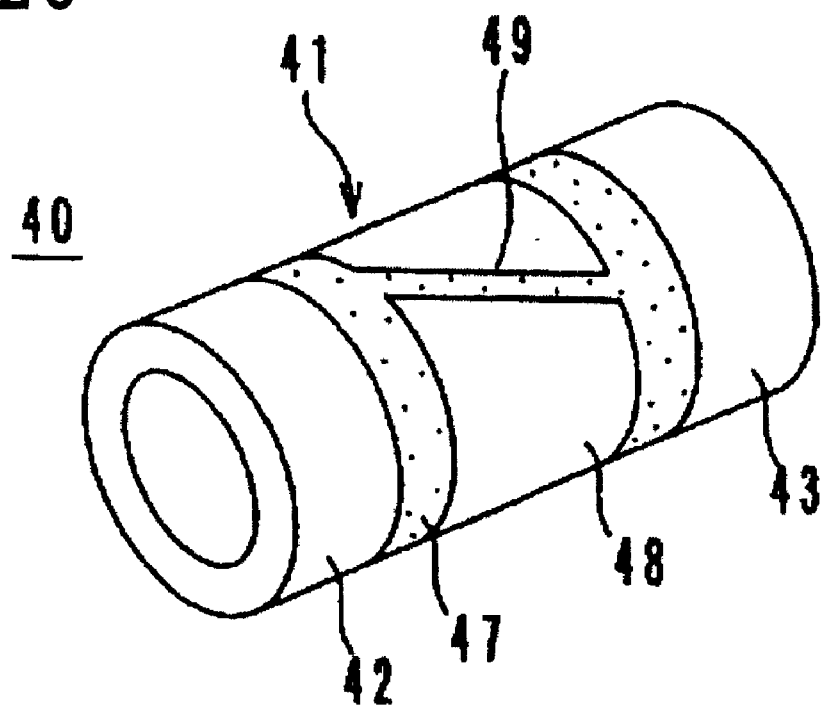
FIG. 20 is a perspective view showing an even further preferred embodiment of the present invention.

An example of modifications of the preferred embodiment shown in FIG. 12 may be an LC component 40 shown in FIG. 20. The LC component 40 shown in FIG. 20 is different from the preferred embodiment of FIG. 12 in that a capacitor electrode 48 is divided by one cut groove 49. The cut groove 49 is elongated obliquely with respect to the width direction of the capacitor electrode 48 (substantially perpendicular to the peripheral direction of the LC component 40).

As seen in the above-description, according to preferred embodiments of the present invention, a capacitor electrode has no function as a short ring, since it is divided by a cut groove. Therefore, an LC component can be produced in which the energy loss is suppressed, that is, reduction of the Q value and inductance of the coil is prevented.

It should be understood that the foregoing description is only illustrative of the present invention. Various alternatives and modifications can be devised by those skilled in the art without departing from the invention. Accordingly, the present invention is intended to embrace all such alternatives, modifications and variations which fall within the scope of the appended claims.

What is claimed is:

1. An LC component comprising:

a core member;

a coil conductor spirally wound around the outer peripheral surface of said core member;

a dielectric layer arranged to cover said coil conductor;

a capacitor electrode disposed on said dielectric layer;

a first cut groove crossing said capacitor electrode from one side of a first surface of the capacitor electrode to the other side of a second surface adjacent to the first surface; and a second cut groove crossing said capacitor electrode from one side of a third surface of the capacitor electrode to the other side of a fourth surface adjacent to the third surface.

2. An LC component according to claim 1, wherein said capacitor electrode is divided by the two cut grooves.

3. An LC component according to claim 1, wherein at least one of said cut grooves is arranged to cross the capacitor electrode obliquely from one side of a first surface to the other side of a second adjacent to said first surface.

4. An LC component according to claim 1, wherein said core member has a substantially circular cross section.

5. An LC component according to claim 1, wherein said core member has a substantially rectangular cross section.

6. An LC component according to claim 1, wherein said coil conductor is a spiral coil.

7. An LC component according to claim 1, wherein said capacitor electrode has a band shape.

8. An LC component according to claim 1, wherein the coil conductor covered with said dielectric layer is protected by the dielectric layer.

9. An LC component according to claim 1, wherein at least one of said cut groove of said is curved.

10. An LC component according to claim 1, wherein at least one of said cut grooves has a ladder configuration.

11. An LC component according to claim 1, further comprising input and output electrodes provided at longitudinal end portions of said core member.

12. An LC component according to claim 1, further including an insulation armor resin provided on the LC component.

13. An LC component comprising:

a wound core member having a substantially rectangular cross section;

a coil conductor spirally wound around an outer peripheral surface of said wound core member;

a dielectric layer arranged to cover said coil conductor;

a capacitor electrode provided on said dielectric layer wound approximately once around said wound core member in the outer peripheral direction of said wound core member;

a first cut groove crossing said capacitor electrode from one side of a first surface of the capacitor electrode to the other side of a second surface adjacent to the first surface; and a second cut groove crossing said capacitor electrode from one side of a third surface of the capacitor electrode to the other side of a fourth surface adjacent to the third surface.

14. An LC component according to claim 13, wherein said first cut groove and said second cut groove cross said capacitor electrode obliquely with respect to the longitudinal axis of the wound core member.

15. An LC component according to claim 13, wherein said first cut groove and said second cut groove are curved.

16. An LC component according to claim 13, wherein said first cut groove and said second cut groove have a ladder configuration.

17. An LC component comprising:

a wound core member having a substantially circular cross section;

a coil conductor spirally wound around the outer peripheral surface of said wound core member;

a dielectric layer arranged to cover said coil conductor;

a capacitor electrode disposed on said dielectric layer so as to wind approximately one lap around said wound core member in the outer peripheral direction of said wound core member, and having four areas in the outer peripheral direction of the wound core member;

a first cut groove crossing said capacitor electrode from one side of the first area of said capacitor electrode to the other side of the second area adjacent to the first area; and a second cut groove crossing said capacitor electrode from one side of the third area of the capacitor electrode to the other side of the fourth area adjacent to the third area.

18. An LC component according to claim 17, wherein said first cut groove and said second cut groove cross said capacitor electrode obliquely with respect to the longitudinal axis of the wound core member.

19. An LC component according to claim 17, wherein said first cut groove and said second cut groove are curved.

20. An LC component according to claim 17, wherein said first cut groove and said second cut groove have a ladder configuration.

* * * * *